United States Patent
Weidman et al.

(10) Patent No.: US 12,436,464 B2
(45) Date of Patent: Oct. 7, 2025

(54) PRE-EXPOSURE PHOTORESIST CURING TO ENHANCE EUV LITHOGRAPHIC PERFORMANCE

(71) Applicant: Lam Research Corporation, Fremont, CA (US)

(72) Inventors: Timothy William Weidman, Sunnyvale, CA (US); Kevin Li Gu, Mountain View, CA (US); Chenghao Wu, San Jose, CA (US); Katie Lynn Nardi, San Jose, CA (US); Boris Volosskiy, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 32 days.

(21) Appl. No.: 17/995,355

(22) PCT Filed: Mar. 31, 2021

(86) PCT No.: PCT/US2021/025111
§ 371 (c)(1),
(2) Date: Oct. 3, 2022

(87) PCT Pub. No.: WO2021/202681
PCT Pub. Date: Oct. 7, 2021

(65) Prior Publication Data
US 2023/0185196 A1    Jun. 15, 2023

Related U.S. Application Data

(60) Provisional application No. 63/005,075, filed on Apr. 3, 2020.

(51) Int. Cl.
G03F 7/16    (2006.01)
G03F 7/004   (2006.01)

(52) U.S. Cl.
CPC ............ *G03F 7/168* (2013.01); *G03F 7/0043* (2013.01)

(58) Field of Classification Search
CPC ...... G03F 7/0042; G03F 7/0043; G03F 7/167; G03F 7/168; G03F 7/2022; G03F 7/36;
(Continued)

(56) References Cited

U.S. PATENT DOCUMENTS

| | | | |
|---|---|---|---|
| 3,442,648 A | 5/1969 | Smith et al. | |
| 3,513,010 A | 5/1970 | Notley et al. | |

(Continued)

FOREIGN PATENT DOCUMENTS

| | | |
|---|---|---|
| CN | 101828266 A | 9/2010 |
| CN | 103119695 A | 5/2013 |

(Continued)

OTHER PUBLICATIONS

Chinese First Office Action dated May 24, 2017 issued in Application No. CN 201510053668.7.

(Continued)

*Primary Examiner* — Deoram Persaud
(74) *Attorney, Agent, or Firm* — Weaver Austin Villeneuve & Sampson LLP

(57) ABSTRACT

Disclosed herein are methods and apparatuses for exposing an organic metal-oxide film to a blanket UV treatment prior to a lithographic patterning operation. A blanket UV treatment may be used to shift a solubility curve of the film, such that a lower EUV dose may be used to pattern the film. Additionally, a blanket UV treatment may be used after development to further cure the film.

25 Claims, 5 Drawing Sheets

(58) Field of Classification Search
CPC ............... G03F 7/40; H01L 21/02115; H01L 21/02164; H01L 21/02211; H01L 21/02274; H01L 21/0228; H01L 21/0273; H01L 21/0332; H01L 21/31122; H01L 21/31138; H01L 21/31144; H01L 21/32; H01L 21/32105

See application file for complete search history.

(56) References Cited

U.S. PATENT DOCUMENTS

| | | |
|---|---|---|
| 3,529,963 A | 9/1970 | Marchese et al. |
| 3,576,755 A | 4/1971 | Patella et al. |
| 3,720,515 A | 3/1973 | Stanley |
| 4,241,165 A | 12/1980 | Hughes et al. |
| 4,328,298 A | 5/1982 | Nester |
| 4,590,149 A | 5/1986 | Nakane et al. |
| 4,814,243 A | 3/1989 | Ziger |
| 4,834,834 A | 5/1989 | Ehrlich et al. |
| 4,845,053 A | 7/1989 | Zajac |
| 5,077,085 A | 12/1991 | Schnur et al. |
| 5,445,988 A | 8/1995 | Schwalke |
| 5,534,312 A | 7/1996 | Hill et al. |
| 5,798,203 A | 8/1998 | Haraguchi et al. |
| 6,017,553 A | 1/2000 | Burrell et al. |
| 6,162,577 A | 12/2000 | Felter et al. |
| 6,245,650 B1 | 6/2001 | Watanabe |
| 6,261,938 B1 | 7/2001 | Beauvais et al. |
| 6,348,239 B1 | 2/2002 | Hill et al. |
| 6,797,439 B1 | 9/2004 | Alpay |
| 6,841,943 B2 | 1/2005 | Vahedi et al. |
| 7,232,742 B1 | 6/2007 | Maekawa |
| 8,465,903 B2 | 6/2013 | Weidman et al. |
| 8,552,334 B2 | 10/2013 | Tappan et al. |
| 8,664,124 B2 | 3/2014 | Graff |
| 8,664,513 B2 | 3/2014 | Pfenninger et al. |
| 8,808,561 B2 | 8/2014 | Kanarik |
| 8,883,028 B2 | 11/2014 | Kanarik |
| 9,023,731 B2 | 5/2015 | Ji et al. |
| 9,551,924 B2 | 1/2017 | Burkhardt et al. |
| 9,576,811 B2 | 2/2017 | Kanarik et al. |
| 9,778,561 B2 | 10/2017 | Marks et al. |
| 9,996,004 B2 | 6/2018 | Smith et al. |
| 10,514,598 B2 | 12/2019 | Marks et al. |
| 10,580,585 B2 | 3/2020 | Snaith et al. |
| 10,796,912 B2 | 10/2020 | Shamma et al. |
| 10,831,096 B2 | 11/2020 | Marks et al. |
| 11,209,729 B2 | 12/2021 | Marks et al. |
| 11,257,674 B2 | 2/2022 | Shamma et al. |
| 2001/0024769 A1 | 9/2001 | Donoghue et al. |
| 2002/0180372 A1 | 12/2002 | Yamazaki |
| 2003/0049571 A1 | 3/2003 | Hallock et al. |
| 2004/0113087 A1 | 6/2004 | Ikeda et al. |
| 2004/0175631 A1 | 9/2004 | Crocker et al. |
| 2004/0191423 A1 | 9/2004 | Ruan et al. |
| 2004/0209201 A1 | 10/2004 | Nakano et al. |
| 2004/0213563 A1 | 10/2004 | Irie |
| 2005/0167617 A1 | 8/2005 | Derra et al. |
| 2005/0208389 A1 | 9/2005 | Ishibashi et al. |
| 2005/0250052 A1 | 11/2005 | Nguyen |
| 2005/0253077 A1 | 11/2005 | Ikeda et al. |
| 2006/0001064 A1 | 1/2006 | Hill et al. |
| 2006/0068173 A1 | 3/2006 | Kajiyama et al. |
| 2006/0147818 A1 | 7/2006 | Lee |
| 2006/0166537 A1 | 7/2006 | Thompson et al. |
| 2006/0172530 A1 | 8/2006 | Cheng et al. |
| 2006/0175558 A1 | 8/2006 | Bakker et al. |
| 2007/0037357 A1 | 2/2007 | Culp |
| 2007/0037410 A1 | 2/2007 | Chang et al. |
| 2007/0074541 A1 | 4/2007 | Badding et al. |
| 2007/0117040 A1 | 5/2007 | Brock et al. |
| 2007/0181816 A1 | 8/2007 | Ikeda et al. |
| 2007/0212889 A1 | 9/2007 | Abatchev et al. |
| 2008/0004203 A1 | 1/2008 | Scheuing et al. |
| 2008/0070128 A1 | 3/2008 | Wu et al. |
| 2008/0157011 A1 | 7/2008 | Nagai et al. |
| 2008/0236620 A1 | 10/2008 | Shih et al. |
| 2009/0041650 A1 | 2/2009 | Watanabe et al. |
| 2009/0134119 A1 | 5/2009 | Matsumaru et al. |
| 2009/0208880 A1 | 8/2009 | Nemani et al. |
| 2009/0239155 A1 | 9/2009 | Levinson et al. |
| 2009/0286402 A1 | 11/2009 | Xia et al. |
| 2009/0305174 A1 | 12/2009 | Shiobara et al. |
| 2009/0317742 A1 | 12/2009 | Toriumi et al. |
| 2009/0321707 A1 | 12/2009 | Metz et al. |
| 2010/0022078 A1 | 1/2010 | Rockenberger et al. |
| 2010/0051446 A1 | 3/2010 | Wang et al. |
| 2010/0075508 A1 | 3/2010 | Seino et al. |
| 2010/0131093 A1 | 5/2010 | Yokoyama et al. |
| 2010/0197135 A1 | 8/2010 | Ishizaka |
| 2010/0266969 A1 | 10/2010 | Shiraishi et al. |
| 2010/0297847 A1 | 11/2010 | Cheng et al. |
| 2010/0304027 A1 | 12/2010 | Lee et al. |
| 2011/0028000 A1 | 2/2011 | Rogojina et al. |
| 2011/0104595 A1 | 5/2011 | Hayashi et al. |
| 2011/0195362 A1 | 8/2011 | Watanabe et al. |
| 2012/0068347 A1 | 3/2012 | Isobayashi et al. |
| 2012/0088193 A1 | 4/2012 | Weidman et al. |
| 2012/0088369 A1 | 4/2012 | Weidman et al. |
| 2012/0126358 A1 | 5/2012 | Arnold et al. |
| 2012/0193762 A1 | 8/2012 | Lin et al. |
| 2012/0202357 A1 | 8/2012 | Sato et al. |
| 2012/0223418 A1 | 9/2012 | Stowers et al. |
| 2013/0023124 A1 | 1/2013 | Nemani et al. |
| 2013/0129995 A1 | 5/2013 | Ouattara et al. |
| 2013/0164691 A1 | 6/2013 | Shiobara |
| 2013/0177847 A1 | 7/2013 | Chatterjee et al. |
| 2013/0183609 A1 | 7/2013 | Seon et al. |
| 2013/0224652 A1 | 8/2013 | Bass et al. |
| 2013/0330932 A1 | 12/2013 | Rangarajan et al. |
| 2014/0120688 A1 | 5/2014 | Booth, Jr. et al. |
| 2014/0134827 A1 | 5/2014 | Swaminathan et al. |
| 2014/0170563 A1 | 6/2014 | Hatakeyama |
| 2014/0170853 A1 | 6/2014 | Shamma et al. |
| 2014/0175617 A1 | 6/2014 | Antonelli et al. |
| 2014/0193580 A1 | 7/2014 | Tiron et al. |
| 2014/0206200 A1 | 7/2014 | Nelson |
| 2014/0220489 A1 | 8/2014 | Kozuma et al. |
| 2014/0220495 A1 | 8/2014 | Bozano et al. |
| 2014/0239462 A1 | 8/2014 | Shamma et al. |
| 2014/0263172 A1 | 9/2014 | Xie et al. |
| 2014/0268082 A1 | 9/2014 | Michaelson et al. |
| 2015/0041809 A1 | 2/2015 | Arnold et al. |
| 2015/0077733 A1 | 3/2015 | Huang et al. |
| 2015/0079393 A1 | 3/2015 | Freedman et al. |
| 2015/0125679 A1 | 5/2015 | Ishikawa |
| 2015/0132965 A1 | 5/2015 | Devilliers et al. |
| 2015/0170957 A1 | 6/2015 | Tsao |
| 2015/0217330 A1 | 8/2015 | Haukka et al. |
| 2015/0221519 A1 | 8/2015 | Marks et al. |
| 2015/0243520 A1 | 8/2015 | Park et al. |
| 2015/0332922 A1 | 11/2015 | Chien et al. |
| 2016/0035631 A1 | 2/2016 | Lee et al. |
| 2016/0116839 A1 | 4/2016 | Meyers et al. |
| 2016/0118246 A1 | 4/2016 | Kang et al. |
| 2016/0135274 A1 | 5/2016 | Fischer et al. |
| 2016/0179005 A1 | 6/2016 | Shamma et al. |
| 2016/0216606 A1 | 7/2016 | Meyers et al. |
| 2016/0293405 A1 | 10/2016 | Matsumoto et al. |
| 2016/0314964 A1 | 10/2016 | Tang et al. |
| 2016/0357103 A1 | 12/2016 | Nagahara et al. |
| 2016/0365248 A1 | 12/2016 | Mebarki et al. |
| 2016/0379824 A1 | 12/2016 | Wise et al. |
| 2017/0066225 A1 | 3/2017 | Chen et al. |
| 2017/0069462 A1 | 3/2017 | Kanarik et al. |
| 2017/0092495 A1 | 3/2017 | Chen et al. |
| 2017/0097570 A1* | 4/2017 | Tagawa ............... G03F 7/26 |
| 2017/0102612 A1 | 4/2017 | Meyers et al. |
| 2017/0146909 A1 | 5/2017 | Smith et al. |
| 2017/0192357 A1 | 7/2017 | Carcasi et al. |
| 2018/0004083 A1 | 1/2018 | Marks et al. |
| 2018/0012759 A1 | 1/2018 | Smith et al. |
| 2018/0039182 A1 | 2/2018 | Zi et al. |
| 2018/0061663 A1 | 3/2018 | Chandrashekar et al. |
| 2018/0096840 A1 | 4/2018 | Jeong et al. |

(56) References Cited

U.S. PATENT DOCUMENTS

| | | | |
|---|---|---|---|
| 2018/0149976 A1 | 5/2018 | Liu et al. | |
| 2018/0151350 A1 | 5/2018 | Li | |
| 2018/0164689 A1 | 6/2018 | Sano et al. | |
| 2018/0308687 A1 | 10/2018 | Smith et al. | |
| 2018/0337046 A1 | 11/2018 | Shamma et al. | |
| 2018/0356731 A1 | 12/2018 | Tagawa | |
| 2019/0027357 A1 | 1/2019 | Girard et al. | |
| 2019/0043731 A1 | 2/2019 | Bristol et al. | |
| 2019/0056914 A1* | 2/2019 | Ma | G03F 7/38 |
| 2019/0094685 A1 | 3/2019 | Marks et al. | |
| 2019/0163056 A1 | 5/2019 | Maes et al. | |
| 2019/0163065 A1 | 5/2019 | Hatakeyama et al. | |
| 2019/0187556 A1 | 6/2019 | Park et al. | |
| 2019/0198338 A1 | 6/2019 | Kim et al. | |
| 2019/0348292 A1 | 11/2019 | Dutta et al. | |
| 2020/0050109 A1 | 2/2020 | Ho et al. | |
| 2020/0066536 A1 | 2/2020 | Yaegashi | |
| 2020/0089104 A1 | 3/2020 | Marks et al. | |
| 2020/0124970 A1 | 4/2020 | Kocsis et al. | |
| 2020/0174374 A1 | 6/2020 | Liao et al. | |
| 2020/0326627 A1 | 10/2020 | Jiang et al. | |
| 2021/0013037 A1 | 1/2021 | Sun et al. | |
| 2021/0041784 A1 | 2/2021 | Chen et al. | |
| 2021/0216016 A1* | 7/2021 | Tagawa | G03F 7/0045 |
| 2021/0271170 A1 | 9/2021 | Telecky et al. | |
| 2021/0302833 A1 | 9/2021 | Weng et al. | |
| 2021/0349390 A1* | 11/2021 | de Schepper | G03F 7/2004 |
| 2022/0037152 A1 | 2/2022 | Raley et al. | |
| 2022/0075260 A1 | 3/2022 | Marks et al. | |
| 2022/0122846 A1 | 4/2022 | Shamma et al. | |
| 2022/0157617 A1 | 5/2022 | Zhou et al. | |
| 2022/0216050 A1 | 7/2022 | Yu et al. | |
| 2023/0152705 A1* | 5/2023 | Grzeskowiak | G03F 7/40 430/30 |
| 2023/0230811 A1* | 7/2023 | Yu | H01L 21/0274 430/14 |
| 2023/0266670 A1 | 8/2023 | Hansen et al. | |
| 2023/0341781 A1 | 10/2023 | Han et al. | |
| 2024/0036474 A1 | 2/2024 | Peter et al. | |
| 2024/0192590 A1 | 6/2024 | Kanakasabapathy et al. | |
| 2024/0329539 A1 | 10/2024 | Tan et al. | |
| 2025/0053084 A1 | 2/2025 | Hansen et al. | |
| 2025/0093781 A1 | 3/2025 | Peter et al. | |

FOREIGN PATENT DOCUMENTS

| | | |
|---|---|---|
| CN | 103243310 A | 8/2013 |
| CN | 104637792 A | 5/2015 |
| CN | 105489635 A | 4/2016 |
| CN | 107153326 A | 9/2017 |
| CN | 116009357 A | 4/2023 |
| EP | 2608247 A1 | 6/2013 |
| EP | 3258317 A1 | 12/2017 |
| EP | 3596155 B1 | 8/2022 |
| JP | S52144972 A | 12/1977 |
| JP | H03228327 A | 10/1991 |
| JP | H0572747 A | 3/1993 |
| JP | H0745580 A | 2/1995 |
| JP | H0757995 A | 3/1995 |
| JP | H0831781 A | 2/1996 |
| JP | H10172957 A | 6/1998 |
| JP | 2000223461 A | 8/2000 |
| JP | 2001250813 A | 9/2001 |
| JP | 2003213001 A | 7/2003 |
| JP | 2003532303 A | 10/2003 |
| JP | 2004006798 A | 1/2004 |
| JP | 2005504146 A | 2/2005 |
| JP | 2005123651 A | 5/2005 |
| JP | 2005317652 A | 11/2005 |
| JP | 2006253282 A | 9/2006 |
| JP | 2010016083 A | 1/2010 |
| JP | 2010074065 A | 4/2010 |
| JP | 2010245327 A | 10/2010 |
| JP | 2011511476 A | 4/2011 |
| JP | 2011099956 A | 5/2011 |
| JP | 2011520242 A | 7/2011 |
| JP | 2011529126 A | 12/2011 |
| JP | 2012185485 A | 9/2012 |
| JP | 2013526061 A | 6/2013 |
| JP | 2013135066 A | 7/2013 |
| JP | 2013145874 A | 7/2013 |
| JP | 2014521111 A | 8/2014 |
| JP | 2015513540 A | 5/2015 |
| JP | 2015201622 A | 11/2015 |
| JP | 2016131238 A | 7/2016 |
| JP | 2016208027 A | 12/2016 |
| JP | 2018098229 A | 6/2018 |
| JP | 2018518688 A | 7/2018 |
| JP | 2019500490 A | 1/2019 |
| JP | 2019506730 A | 3/2019 |
| JP | 2019053305 A | 4/2019 |
| JP | 2019095794 A | 6/2019 |
| JP | 2020129607 A | 8/2020 |
| JP | 2021005737 A | 1/2021 |
| KR | 100398312 B1 | 9/2003 |
| KR | 100841495 B1 | 6/2008 |
| KR | 20090042059 A | 4/2009 |
| KR | 20130093038 A | 8/2013 |
| KR | 20150129781 A | 11/2015 |
| KR | 20160082969 A | 7/2016 |
| KR | 20190060678 A | 6/2019 |
| KR | 20190085654 A | 7/2019 |
| KR | 20200144580 A | 12/2020 |
| TW | 200947117 A | 11/2009 |
| TW | 201140230 A | 11/2011 |
| TW | 201224190 A | 6/2012 |
| TW | 201241555 A | 10/2012 |
| TW | 201327057 A | 7/2013 |
| TW | 201502696 A | 1/2015 |
| TW | 201539539 A | 10/2015 |
| TW | 201631377 A | 9/2016 |
| TW | 201734667 A | 10/2017 |
| TW | 201826034 A | 7/2018 |
| TW | 201903886 A | 1/2019 |
| TW | 201931011 A | 8/2019 |
| TW | 201937545 A | 9/2019 |
| TW | 202001993 A | 1/2020 |
| TW | 202006168 A | 2/2020 |
| WO | WO-03029015 A2 | 4/2003 |
| WO | WO-2008139621 A1 | 11/2008 |
| WO | WO-2011137059 A2 | 11/2011 |
| WO | WO-2013007442 A1 | 1/2013 |
| WO | WO-2013128313 A1 | 9/2013 |
| WO | WO-2014152023 A1 | 9/2014 |
| WO | WO-2017066319 A2 | 4/2017 |
| WO | WO-2018061670 A1 | 4/2018 |
| WO | WO-2019059074 A1 | 3/2019 |
| WO | WO-2019217749 A1 | 11/2019 |
| WO | WO-2019230462 A1 | 12/2019 |
| WO | WO-2020132281 A1 | 6/2020 |
| WO | WO-2020190941 A1 | 9/2020 |
| WO | WO-2020223011 A1 | 11/2020 |
| WO | WO-2020263750 A1 | 12/2020 |
| WO | WO-2020264158 A1 | 12/2020 |
| WO | WO-2020264556 A1 | 12/2020 |
| WO | WO-2020264571 A1 | 12/2020 |
| WO | WO-2021202681 A1 | 10/2021 |
| WO | WO-2021262529 A1 | 12/2021 |
| WO | WO-2022006349 A1 | 1/2022 |
| WO | WO-2022016128 A1 | 1/2022 |

OTHER PUBLICATIONS

Chinese Second Office Action dated Feb. 28, 2018 issued in Application No. CN 201510053668.7.

CN Office Action dated Nov. 18, 2022, in Application No. CN201810783756.6 with English translation.

Coons et al., (2010) "Comparison of EUV spectral and ion emission features from laser-produced Sn and Li plasmas," Extreme Ultraviolet (EUV) Lithography, Proc. Of SPIE, 7636:763636-1 to 763636-7.

(56) References Cited

OTHER PUBLICATIONS

Fan, Y. et al., (2016) "Benchmarking Study of EUV Resists for NXE:3300B," Proc. of Spie, 9776:97760W-1 to 97760W-11 [Downloaded From http://proceedings.spiedigitallibrary.org/ on Mar. 30, 2017].
FUJIFILM Corp., (Presentation) "Negative tone development process for double patterning," 5th International Symposium on Immersion Lithography, Sep. 2008, Presentation Slides No. p. 1-p. 27.
FUJIFILM Corp., (Safety Data Sheet) Name of Substance: n-Butyl acetate; Trade Name of Substance: FN-DP001 Ultra Pure Developer, Revision Date: Nov. 25, 2013, MSDS file: 16328_GB_EN_V2.0, pp. 1-9.
Gangnaik, A.S. et al., (Jan. 12, 2017) "New Generation Electron Beam Resists: A Review," Chem. Mater., 29:1898-1917.
Gerritsen et al., (Apr. 1, 1986) "Laser-generated plasma as soft x-ray source," J. Appl. Phys., 59(7):2337-2344.
International Preliminary Report on Patentability dated Oct. 13, 2022, in PCT Application No. PCT/US2021/025111.
International Search Report and Written Opinion dated Jul. 20, 2021, in PCT Application No. PCT/US2021/025111.
International Preliminary Report on Patentability dated Nov. 11, 2021, for International Application No. PCT/US2020/028151.
International Preliminary Report on Patentability dated Nov. 28, 2019 issued in Application No. PCT/US2018/032783.
International Preliminary Report on Patentability dated Nov. 7, 2019 issued in Application No. PCT/US2018/028192.
International Preliminary Report on Patentability dated Sep. 9, 2022, in PCT Application No. PCT/US2021/019245.
International Preliminary Report on Patentability dated Sep. 30, 2021 issued in Application No. PCT/US2020/023146.
International Search Report and Written Opinion dated Aug. 8, 2018 issued in Application No. PCT/US2018/028192.
International Search Report and Written Opinion dated Jul. 17, 2020 issued in Application No. PCT/US2020/023146.
International Search Report and Written Opinion dated Jul. 31, 2020, in PCT Application No. PCT/US2020/028151.
International Search Report and Written Opinion dated Oct. 16, 2018 issued in Application No. PCT/US2018/032783.
Japanese Decision to Grant dated Feb. 12, 2019 issued in Application No. JP 2015-016254.
Japanese Decision to Grant dated May 3, 2021 issued in Application No. JP 2016-220096.
Japanese First Office Action dated Oct. 30, 2018 issued in Application No. JP 2015-016254.
Japanese First Office Action dated Sep. 15, 2020 issued in Application No. JP 2016-220096.
JP Office Action dated Jul. 26, 2022 in Application No. JP2021102822 With English translation.
JP Office Action dated Jun. 14, 2022, in Application No. JP20190563508 with English translation.
Korean Decision for Grant dated Sep. 2, 2021 issued in Application No. KR 10-2015-0015184.
Korean First Office Action dated Dec. 22, 2020 issued in Application No. KR 10-2015-0015184.
Korean Second Office Action dated Jul. 27, 2021 issued in Application No. KR 10-2015-0015184.
McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.
Rothschild, et al., "Liquid immersion lithography: Why, how, and when?" Journal Vacuum Science Technology, Nov./Dec. 2004, pp. 2877-2881.
Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] URL: http:dx.doi.org/10.7567/APEX.7.016501.
Spitzer et al., (Mar. 1, 1986) "Conversion efficiencies from laser-produced plasmas in the extreme ultraviolet regime," J. Appl. Phys., 79(5):2251-2258.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
Stulen, et al., "Extreme Ultraviolet Lithography" IEEE Journal of Quantum Electronics, vol. 35, No. 5, May 1999, pp. 694-699.
Taiwanese First Office Action dated Aug. 10, 2020 issued in Application No. TW 105137362.
Taiwanese First Office Action dated May 31, 2018 issued in Application No. TW 104103153.
Taiwanese Second Office Action dated Nov. 18, 2020 issued in Application No. TW 105137362.
TW Office Action dated Sep. 8, 2022 in Application No. TW111123386 with English translation.
TW First Office Action dated Oct. 6, 2021, in application No. TW20180116415 with English translation.
TW Office Action dated Apr. 29, 2022 in Application No. TW110118172 with English translation.
Final Office Action, dated Feb. 5, 2019 issued in U.S. Appl. No. 15/495,701.
Final Office Action, dated May 11, 2017, issued in U.S. Appl. No. 14/610,038.
Final Office Action, dated Sep. 10, 2018, issued in U.S. Appl. No. 15/691,659.
Notice of Allowance, dated Apr. 25, 2018 issued in U.S. Appl. No. 14/948,109.
Notice of Allowance, dated Aug. 22, 2017, issued in U.S. Appl. No. 14/610,038.
Notice of Allowance, dated Jul. 28, 2020, issued in U.S. Appl. No. 16/206,959.
Notice of Allowance, dated Jun. 10, 2020 issued in U.S. Appl. No. 15/979,340.
Notice of Allowance dated Sep. 15, 2021, issued in U.S. Appl. No. 16/691,508.
Notice of Allowance, dated Sep. 19, 2019, issued in U.S. Appl. No. 15/691,659.
Notice of Allowance, dated Sep. 30, 2021 issued in U.S. Appl. No. 17/008,095.
Notice of Allowance dated Sep. 9, 2021, issued in U.S. Appl. No. 16/691,508.
Office Action, dated Apr. 9, 2019, issued in U.S. Appl. No. 15/691,659.
Office Action, dated Aug. 9, 2018 issued in U.S. Appl. No. 15/495,701.
Office Action, dated Jan. 23, 2017, issued in U.S. Appl. No. 14/610,038.
Office Action, dated Mar. 18, 2021 issued in U.S. Appl. No. 17/008,095.
Office Action, dated Mar. 5, 2020, issued in U.S. Appl. No. 16/206,959.
Office Action dated May 14, 2021, issued in U.S. Appl. No. 16/691,508.
Office Action, dated May 21, 2018, issued in U.S. Appl. No. 15/691,659.
Office Action, dated Nov. 2, 2017, issued in U.S. Appl. No. 14/948,109.
Office Action, dated Nov. 6, 2019 issued in U.S. Appl. No. 15/979,340.
U.S. Appl. No. 17/759,896, inventors Nagabhirava et al., filed on Aug. 1, 2022.
U.S. Restriction Requirement dated Nov. 14, 2022 in U.S. Appl. No. 17/455,185.
U.S. Supplemental Notice of Allowability dated Jan. 26, 2022, in U.S. Appl. No. 17/008,095.
Wang, et al., "Lithography Simulation for the Fabrication of Silicon Photonic Devices with Deep-Ultraviolet Lithography" IEEE, (2012) pp. 288-290.
CN Office Action dated Jan. 22, 2024 in CN Application No. 202080047683.X, with English Translation.
CN Office Action dated Jul. 26, 2024 in CN Application No. 202080047683.X with English translation.
EP Extended European Search Report dated Jun. 26, 2023, in Application No. 20831343.7.
International Search Report and Written Opinion dated Jul. 13, 2021, in PCT Application No. PCT/US2021/023901.

(56) References Cited

OTHER PUBLICATIONS

International Preliminary Report on Patentability and Written Opinion dated Feb. 8, 2024 in PCT Application No. PCT/US2022/037393.
International Preliminary Report on Patentability and Written Opinion dated Feb. 8, 2024 in PCT Application No. PCT/US2022/037733.
International Preliminary Report on Patentability and Written Opinion dated Jun. 27, 2024 in PCT Application No. PCT/US2022/081376.
International Preliminary Report on Patentability and Written Opinion dated Nov. 14, 2024 in PCT Application No. PCT/US2023/019871.
International Preliminary Report on Patentability dated Jan. 26, 2023 in PCT Application No. PCT/US2021/042106.
International Preliminary Report on Patentability dated Oct. 12, 2023, in PCT Application No. PCT/US2022/022790.
International Preliminary Report on Patentability dated Oct. 13, 2022, in PCT Application No. PCT/US2021/023901.
International Search Report and Written Opinion dated Apr. 17, 2023 in PCT Application No. PCT/US2022/081376.
International Search Report and Written Opinion dated Aug. 17, 2023, in Application No. PCT/US2023/019871.
International Search Report and Written Opinion dated Aug. 28, 2024 in PCT Application No. PCT/US2024/028046.
International Search Report and Written Opinion dated Jul. 22, 2022 in Application No. PCT/US2022/022790.
International Search Report and Written Opinion dated Nov. 4, 2021 in PCT Application No. PCT/US2021/042106.
International Search Report and Written Opinion dated Nov. 7, 2022 in PCT Application No. PCT/US2022/037393.
JP Office Action dated Aug. 6, 2024 in JP Application No. 2023-558732, with English Translation.
JP Office Action dated Dec. 3, 2024 in JP Application No. 2023-558732 with English translation.
JP Office Action dated Dec. 26, 2023 in JP Application No. 20210576241, with English Translation.
JP Office Action dated Mar. 26, 2024 in JP Application No. 2023-558732 with English translation.
JP Office Action dated May 14, 2024 in JP Application No. 2021-576241 with English translation.
JP Office Action dated Oct. 22, 2024 in JP Application No. 2022-547251 with English translation.
KR Notice of Allowances dated Jul. 8, 2024, in KR Application No. 10-2024-7006338 with English Translation.
KR Office Action dated Nov. 28, 2024 in KR Application No. 10-2022-7014896, with English Translation.
SG Search Report and Written Opinion dated Jul. 3, 2024 in SG Application No. 11202114196U.
SG Search Report and Written Opinion dated May 14, 2024 in SG Application No. 11202251864Y.
SG Written Opinion dated Jul. 31, 2024 in SG Application No. 11202307119P.
TW Office Action and Search Report dated Dec. 25, 2024 in TW Application No. 111112111, with English Translation.
TW Office Action dated Apr. 17, 2024 in TW Application No. 111112111 with English translation.
TW Office Action dated Aug. 6, 2024 in TW Application No. 110122525, with English Translation.
TW Office Action dated Aug. 8, 2024 in TW Application No. 111112111, with English Translation.
TW Office Action dated Jul. 2, 2024 in TW Application No. 109134940 with English translation.
TW Office Action dated Jul. 23, 2024 in TW Application No. 110111878, with English Translation.
TW Office Action dated Jun. 27, 2024 in TW Application No. 110103944, with English Translation.
TW Office Action dated Mar. 11, 2024 in TW Application No. 109121649, with English Translation.
TW Office Action dated Nov. 7, 2024 in TW Application No. 111112111, with English Translation.
TW Office Action dated Nov. 26, 2024 in TW Application No. 110126445, with English Translation.
TW Office Action dated Oct. 4, 2024 in TW Application No. 109121649 with English translation.
TW Office Action dated Sep. 25, 2024 in TW Application No. 110111136 with English translation.
Advisory Action dated Nov. 15, 2024 in U.S. Appl. No. 18/550,733.
Final Office Action dated Sep. 16, 2024 in U.S. Appl. No. 18/550,733.
Non-Final Office Action dated May 31, 2024 in U.S. Appl. No. 18/550,733.
Non-Final Office Action dated Nov. 21, 2024 in U.S. Appl. No. 17/596,858.
U.S. Appl. No. 18/855,026, inventors Lee Y, et al., filed on Oct. 8, 2024.
Restriction requirement dated Feb. 14, 2024, in U.S. Appl. No. 18/550,733.
Restriction Requirement dated Jun. 21, 2024 in U.S. Appl. No. 17/596,858.
KR Office Action dated May 29, 2025 in KR Application No. 10-2022-7038499, with English Translation.
EP Extended European Search report dated Apr. 15, 2025 in EP Application No. 22782195.6.
JP Office Action dated Apr. 30, 2025 in JP Application No. 2022547251, with English Translation.
JP Office Action dated Jun. 24, 2025 in JP Application No. 2022577244, with English Translation.
JP Office Action dated May 13, 2025 in JP Application No. 2023-502906, with English Translation.
KR Office Action dated Apr. 14, 2025 in KR Application No. 10-2022-7030615, with English Translation.
KR Office Action dated Jun. 12, 2025 in KR Application No. 10-2023-7001454, with English Translation.
U.S. Final Office Action dated Apr. 21, 2025 in U.S. Appl. No. 17/596,858.
US Non-Final Office Action dated Apr. 23, 2025 in U.S. Appl. No. 18/550,733.
US Non-Final Office Action dated Jun. 5, 2025 in U.S. Appl. No. 17/758,567.
US Non-Final Office Action dated Jun. 18, 2025 in U.S. Appl. No. 17/753,110.
U.S. Appl. No. 19/202,425, inventors Hansen E.C et al., filed on May 8, 2025.
International Search Report and Written Opinion dated Feb. 20, 2025 in PCT Application No. PCT/US2024/054806..
JP Office Action dated Feb. 18, 2025 in JP Application No. 2022-557680, with English Translation.
JP Office Action dated Mar. 4, 2025 in JP Application No. 2022-577244, with English Translation.
KR Office Action dated Mar. 13, 2025 in KR Application No. 10-2023-7004801, with English Translation.
KR Office Action dated Mar. 19, 2025 in KR Application No. 10-2022-7038020, with English Translation.
KR Office Action dated Mar. 27, 2025 in KR Application No. 10-2022-7003371, with English Translation.
TW Office Action dated Mar. 11, 2025 in TW Application No. 110126445, with English Translation.
U.S. Restriction Requirement dated Apr. 3, 2025 in U.S. Appl. No. 17/758,567.
U.S. Restriction Requirement dated Mar. 20, 2025 in U.S. Appl. No. 17/753,110.
U.S. Restriction Requirement dated Mar. 26, 2025 in U.S. Appl. No. 17/905,754.

* cited by examiner

PRE-EXPOSURE PHOTORESIST CURING TO ENHANCE EUV LITHOGRAPHIC PERFORMANCE

INCORPORATED BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

The background description provided herein is for the purpose of generally presenting the context of the present technology. Work of the presently named inventors, to the extent it is described in this background section, as well as aspects of the description that may not otherwise qualify as prior art at the time of filing, are neither expressly nor impliedly admitted as prior art against the present technology.

The fabrication of semiconductor devices, such as integrated circuits, is a multi-step process involving photolithography. In general, the process includes the deposition of material on a wafer, and patterning the material through lithographic techniques to form structural features (e.g., transistors and circuitry) of the semiconductor device. The steps of a typical photolithography process known in the art include: preparing the substrate; applying a photoresist, such as by spin coating; exposing the photoresist to light in a desired pattern, causing the exposed areas of the photoresist to become more or less soluble in a developer solution; developing by applying a developer solution to remove either the exposed or the unexposed areas of the photoresist; and subsequent processing to create features on the areas of the substrate from which the photoresist has been removed, such as by etching or material deposition.

The evolution of semiconductor design has created the need, and has been driven by the ability, to create ever smaller features on semiconductor substrate materials. This progression of technology has been characterized in "Moore's Law" as a doubling of the density of transistors in dense integrated circuits every two years. Indeed, chip design and manufacturing has progressed such that modern microprocessors may contain billions of transistors and other circuit features on a single chip. Individual features on such chips may be on the order of 22 nanometers (nm) or smaller, in some cases less than 10 nm.

One challenge in manufacturing devices having such small features is the ability to reliably and reproducibly create photolithographic masks having sufficient resolution. Current photolithography processes typically use 193 nm ultraviolet (UV) light to expose a photoresist. The fact that the light has a wavelength significantly greater than the desired size of the features to be produced on the semiconductor substrate creates inherent issues. Achieving feature sizes smaller than the wavelength of the light requires use of complex resolution enhancement techniques, such as multipatterning. Thus, there is significant interest and research effort in developing photolithographic techniques using shorter wavelength light, such as extreme ultraviolet radiation (EUV), having a wavelength of from 10 nm to 15 nm, e.g., 13.5 nm.

EUV photolithographic processes can present challenges, however, including low power output and photon absorption stochastics. Traditional organic chemically amplified resists (CAR) similar to those used in 193 nm UV lithography have potential drawbacks when used in EUV lithography, particularly as they have low absorption coefficients in EUV region and the diffusion of photo-activated chemical species can result in blur or line edge roughness. Furthermore, in order to provide the etch resistance required to pattern underlying device layers, small features patterned in conventional CAR materials can result in high aspect ratios at risk of pattern collapse. Accordingly, there remains a need for improved EUV photoresist materials, having such properties as decreased thickness, greater absorbance, and greater etch resistance.

SUMMARY

Disclosed herein are methods and systems of treating a photoresist, the method including: receiving in a process chamber a metal-containing photoresist on a substrate and treating the metal-containing photoresist by exposure to blanket UV to modify material properties of the metal-containing photoresist such that radiation sensitivity of the metal-containing photoresist is increased. In various embodiments, a wavelength of the blanket UV is less than 300 nm, is about 248 nm, is about 193 nm, or is DUV. In some embodiments, an intensity of the blanket UV is between 1 and 100 $mJ/cm^2$. In some embodiments, treating the metal-containing photoresist increases the sensitivity of the metal-containing photoresist to EUV radiation. In various embodiments, treating the metal-containing photoresist increases the adhesion of the metal-containing photoresist to the substrate. In some embodiments, treating the metal-containing photoresist precedes exposing the metal-containing photoresist to EUV lithography. In various embodiments, the solubility of the metal-containing photoresist changes abruptly within a dose range of no more than about 2 $mJ/cm^2$. In some embodiments, treating the metal-containing photoresist further includes a thermal process with control of temperature, pressure, ambient gas chemistry, gas flow/ratio, and moisture.

In various embodiments, the method further includes exposing the metal-containing photoresist to patterned EUV light and developing the metal-containing photoresist to remove portions of the metal-containing photoresist. In some embodiments, an intensity of the EUV light is between 20 and 100 $mJ/cm^2$. In some embodiments, developing the metal-containing photoresist is a dry process. In some embodiments, developing the metal-containing photoresist is a wet process. In various embodiments, developing the metal-containing photoresist is a positive tone process. In some embodiments, developing the metal-containing photoresist is a negative tone process. In some embodiments, the method further includes, after developing the metal-containing photoresist, cleaning the metal-containing photoresist to remove scum. In various embodiments, the method further includes, after developing the metal-containing photoresist, exposing the metal-containing photoresist to additional blanket UV to improve the etch selectivity of the metal-containing photoresist. In various embodiments, exposing the metal-containing photoresist to additional blanket UV is performed in the presence of oxygen. In some embodiments, the partial pressure of oxygen is at least 10 Torr.

These and other features of the disclosed embodiments will be described in detail below with reference to the associated drawings.

DETAILED DESCRIPTION

Introduction and Context

Figure 1:
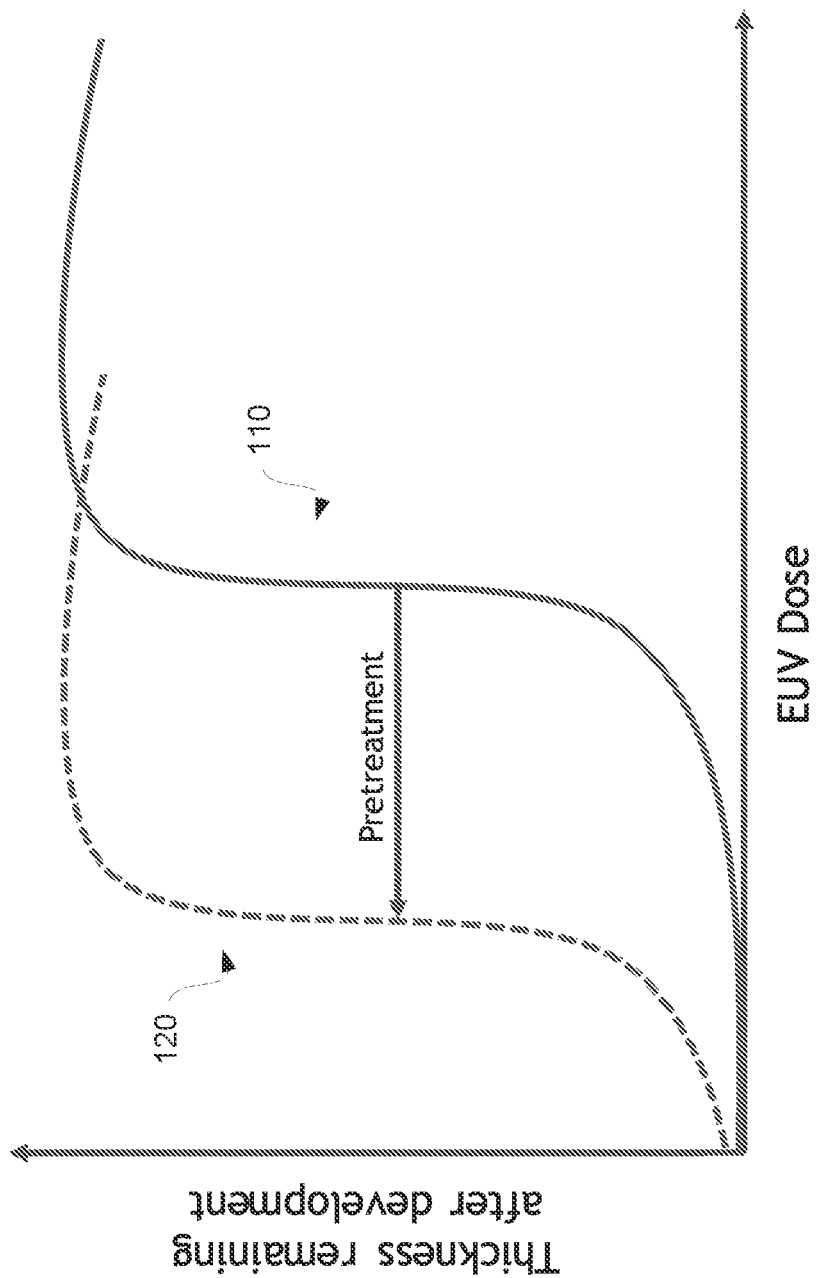
FIG. 1 presents an illustration of a solubility curve for a negative-tone photoresist

This disclosure relates generally to the field of semiconductor processing. In particular aspects, the disclosure is directed to methods and apparatus for processing of EUV photoresists (e.g., EUV-sensitive metal and/or metal oxide-containing resist films) in the context of EUV patterning and EUV patterned film development to form a patterning mask.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Patterning of thin films in semiconductor processing is often an important step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, and so operates in a low-pressure environment.

EUV lithography makes use of EUV resists that are patterned to form masks for use in etching underlying layers. EUV resists may be polymer-based chemically amplified resists (CARs) produced by liquid-based spin-on techniques. An alternative to CARs are directly photopatternable metal oxide-containing films, such as those available from Inpria, Corvallis, OR, and described, for example, in US Patent Publications US 2017/0102612, US 2016/021660 and US 2016/0116839, incorporated by reference herein at least for their disclosure of photopatternable metal oxide-containing films. Such films may be produced by spin-on techniques or dry vapor-deposited. The metal oxide-containing film can be patterned directly (i.e., without the use of a separate photoresist) by EUV exposure in a low-pressure ambient providing sub-30 nm patterning resolution, for example as described in U.S. Pat. No. 9,996,004, issued Jun. 12, 2018 and titled EUV PHOTOPATTERNING OF VAPOR-DEPOSITED METAL OXIDE-CONTAINING HARDMASKS, and/or in Application PCT/US19/31618, filed May 9, 2019, and titled METHODS FOR MAKING EUV PATTERNABLE HARD MASKS, the disclosures of which at least relating to the composition, deposition, and patterning of directly photopatternable metal oxide films to form EUV resist masks is incorporated by reference herein. Generally, the patterning involves exposure of the EUV resist with EUV radiation to form a photo pattern in the resist, followed by development to remove a portion of the resist according to the photo pattern to form the mask.

It should also be understood that while the present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. The specific methods may depend on the particular materials and applications used in the semiconductor substrate and ultimate semiconducting device. Thus, the methods described in this application are merely exemplary of the methods and materials that may be used in present technology.

Directly photopatternable EUV resists may be composed of or contain metals and/or metal oxides mixed within organic components. The metals/metal oxides are highly promising in that they can enhance the EUV photon adsorption and generate secondary electrons and/or show increased etch selectivity to an underlying film stack and device layers. Metal or metal oxide EUV resists may be developed after an EUV patterning exposure by wet or dry techniques.

To date, these resists have been developed using a wet (solvent) approach, which requires the wafer to move to the track, where it is exposed to developing solvent, dried and baked. Wet development may limit productivity and lead to line collapse due to surface tension effects during the evaporation of solvent between fine features. Dry development techniques have been proposed to overcome these issues by eliminating substrate delamination and interface failures. Furthermore, dry development has various environmental advantages. Organic solvents used in various wet processes may require costly disposal procedures compared to dry development chemistries.

CAR films are nearing the limitations of EUV performance and exhibit several drawbacks. They must be significantly thicker than the critical dimensions currently being targeted for EUV resists due to low EUV absorption, which risks pattern collapse during development due to high aspect ratios. More concerning is the broad clearing radius during the acid diffusion process, leading to relatively high line edge roughness in patterned films. Quenchers may be used to reduce the acid diffusion radius, but this comes at the cost of decreased sensitivity, necessitating higher doses and therefore lower scanner throughput and higher costs. The spatial resolution of current CARs is unable to reach the desired EUV lithographic performance for the small pitches required for next-generation device structures.

Organometallic resists enjoy a substantially higher EUV absorption coefficient and can be significantly thinner while still providing good etch resistance. However, it is desired to improve upon their performance by increasing the sensitivity, reducing the line edge roughness, and/or improving the resolution of the film. In particular, the EUV dose required to print well-defined features is considered a critical metric as it defines the throughput of the EUV scanner; any reduction in dose constitutes a significant cost saving.

Blanket UV Exposure Techniques

This disclosure provides methods for blanket treatment of EUV photoresists (PR) after deposition of the PR and prior to lithographic exposure, as well as blanket treatment after development of the lithographic pattern to harden a portion of the remaining PR (the exposed portion in a negative tone resist, or the unexposed portion of the resist in a positive tone resist). Among the effects of an EUV exposure dose on a lithographically-patterned EUV sensitive film, such as an EUV PR, are: 1) inducing a solubility switch and defining the edge profiles of the patterned features, and 2) inducing sufficient PR-substrate adhesion to prevent features from delaminating during wet development. A post-application curing (PAC) involving a blanket UV treatment may improve resist performance by lowering lithographic doses and improving substrate adhesion. A PAC may partially expose the PR without inducing a solubility switch, such that the EUV patterning dose (and therefore time) in the scanner can be significantly reduced. The necessary chemical and structural modifications can be achieved through optical, thermal, plasma, or electron-beam methods. Such strategies can be generally applicable to a dry-deposited EUV PR as well as other metal-containing or CAR resists. Treatment of an EUV PR prior to EUV patterning exposure has various advantages, including reducing EUV dose requirements, increasing throughput/reducing costs to obtain patterned PRs, improving/increasing PR-substrate adhesion, and decoupling treatments to improve adhesion from lithographic patterning doses.

Metal-organic PRs, including dry-deposited and spin-on metal-organic films, such as a tin-oxide PR, may exhibit a contrast curve as shown by line 110 in FIG. 1. The x-axis is increasing EUV dose, while the y-axis is a thickness remaining after development of the lithographic pattern to remove portions of the PR. The y-axis thus indicates how well (e.g., how efficiently/over what dosage range) the EUV dose causes a solubility shift in the PR Line 110 is for a negative-tone resist, where the unexposed portion is removed. Inverse curves may exist for positive-tone resists, where the exposed portion is removed. Line 110 illustrates that the majority of the solubility shift occurs in a narrow region.

For metal-organic PRs, EUV exposure below the threshold dose induces chemical and structural changes inside the PR film, but not changes that are sufficient to cause the switch in solubility in development solvents, as shown by line 110. An underexposed film will remain soluble and no pattern would remain after wet development. However, by pre-exposing the entire PR film at a certain dose below the threshold, the contrast curve can shift, therefore requiring a reduced EUV exposure dose for effective patterning. Line 120 illustrates the effects of a PAC treatment as described herein: the curve has shifted to a lower EUV dose, such that less time is required in an EUV scanner to cause the switch in solubility, representing a large cost-savings. In some embodiments, the sensitivity of the PR refers to a radiation dose sufficient to cause the switch in solubility, such that an increased sensitivity of the PR, for example as a result of techniques disclosed herein, may refer to a lower radiation dose sufficient to cause a switch in solubility for wet or dry development than would otherwise be required without the techniques disclosed herein.

An optical PAC can be realized using EUV flood exposure or other alternative light sources such as deep UV (DUV) and UV light (both low-intensity continuous wave or high-intensity flash). A blanket EUV/DUV/UV exposure is substantially less costly than a lithographic EUV exposure in a scanner, and therefore PAC has the potential to lower the overall cost of the lithographic exposure step by reducing scanner exposure time. An optical pre-exposure treatment as described herein may be performed using any suitable tool with a UV exposure capability. Some particularly suitable examples include the SOLA or LUMIER tools available from Lam Research Corporation, Fremont, CA.

Without wishing to be bound by theory, it is understood that a DUV photon may break a metal-alkyl bond, such as a Sn—C bond, without substantially driving cross-linking. Thus, a blanket UV treatment may be used shift the contrast curve illustrated in FIG. 1 by reducing the EUV dose required for cross-linking without substantially causing cross-linking. This may be advantageous for negative tone resists, where the unexposed portion of the PR is removed. The blanket UV treatment decreases the EUV dose required for cross-linking in exposed areas, which is desirable, yet does not substantially drive cross-linking in the unexposed areas, which would be undesirable. A subsequent lithographic EUV exposure may thus drive cross-linking in the exposed areas with a lower dose than otherwise required to cause a shift in solubility.

EUV photons may break multiple bonds, due at least in part to secondary electron effects, which can desirably drive crosslinking of the metal-oxide film. By comparison, DUV photons, such as 193 nm or 248 nm photons, may only break a single bond. Thus, it can be beneficial to use such a higher wavelength/lower energy blanket UV treatment, either having a broad spectrum in the UV range or at a specific wavelength, e.g., DUV wavelengths of 193 nm or 248 nm, where a single photon may not break multiple bonds and drive cross-linking to reduce the required EUV dose for effective patterning. However, in some embodiments, a lower EUV dose may also have stochastic effects that cause line edge roughness and line width roughness. Higher EUV doses generally reduce roughness, such that in some embodiments a minimum EUV dose is used to sufficiently reduce line roughness. In such embodiments, the UV blanket treatment may be optimized to account for the minimum EUV dose to efficiently balance the UV blanket treatment and the EUV dose for optimum cost and performance.

Another benefit of a PAC as described herein is increased adhesion between the PR and underlying substrate. A substrate may have exposed hydroxyl groups contacted with a hydrocarbyl-substituted tin capping agent to form a hydrocarbyl-terminated SnOx film as the imaging/PR layer on the surface of the substrate. The PAC may improve substrate adhesion of the PR irrespective of lithographic dose. Currently, EUV doses may be higher than necessary to define pattern lines in order to increase adhesion between the PR and the underlying substrate. Being able to decouple adhesion from the EUV exposure would have benefits for substrates that have other attractive features but suffer from delamination as a primary failure mechanism. A blanket UV treatment may thus be used to increase adhesion of the PR to the underlying substrate.

A further benefit of a PAC as described herein is reducing off-gassing of tin-containing species after dry deposition. Off-gassing is undesirable as it can cause cross-contamination. A PAC may reduce off-gassing by cross-linking low molecular weight species, such as the hydrocarbyl-substituted tin capping agents, and/or by chemical conversion to less volatile compounds.

Treatment techniques disclosed herein are generally applicable to EUV PR and other negative tone resists, whether vapor-deposited or spun-on, especially for resists having sharp contrast curves where solubility changes abruptly within a very narrow dose range, as shown in FIG. 1.

While the above discussion focuses on negative tone resists, the same technique may also be applied to positive tone resists. For example, a UV flood light could be applied to reduce the cross-linking in the resist, making the transition to solubility for the exposed region occur at a lower dose. As a result, the same pretreatment strategies described above may be used with positive tone resist systems.

In some embodiments, a similar treatment may instead be performed after the patterned EUV exposure, but prior to development, as a post-exposure cure. In some embodiments, a blanket UV treatment after the patterned EUV exposure may achieve a similar function as a PAC. In other embodiments, however, it may be more advantageous to perform a blanket UV treatment prior to patterned EUV exposure. Without wishing to be bound by theory, it is understood that the blanket UV treatment preferentially breaks metal-alkyl bonds. After patterned EUV exposure, the patterned part of the PR may have fewer metal-alkyl bonds than the unexposed portion. Thus, a blanket EUV treatment after patterned EUV exposure may have a relatively greater effect on the unexposed portions due to the disparity in metal-alkyl bonds, undesirably reducing the contrast between exposed and unexposed portions of the PR.

In some embodiments, a blanket UV treatment technique as discussed herein may be combined with a thermal treatment. For example, the substrate may be baked before or after the patterned EUV exposure. A substrate may be thermally processed with control of temperature, pressure, ambient gas chemistry, gas flow/ratio, and moisture. In some embodiments, the blanket UV treatment may be performed during the thermal processing. Thermal processing of substrate prior to and/or following patterned EUV exposure is further discussed in U.S. Pat. App. No. 62/970,020, filed Feb. 4, 2020 and titled POST APPLICATION/EXPOSURE TREATMENTS TO IMPROVE DRY DEVELOPMENT PERFORMANCE OF METAL-CONTAINING EUV RESIST, the disclosure of which at least in regards to thermally treating a substrate having a metal-containing EUV resist, is hereby incorporated by reference herein.

In some embodiments, a blanket UV treatment technique as discussed herein may be applied after development of the exposed pattern. When applied post-development, the treatments described in this disclosure may be used to harden the patterns remaining on the wafer. This approach may be used for both positive and negative tone development. For positive tone metal-containing resists which undergo crosslinking upon exposure, this approach may prove particularly advantageous since the remaining film is chemically and mechanically fragile. U.S. Pat. App. No. 62/912,330, filed Oct. 8, 2019, discusses techniques for positive tone resist development, and is incorporated herein by reference for the purpose of describing positive tone resist development. Post-development treatment may be used to harden the remaining PR and reduce mask erosion during a subsequent transfer etch.

Furthermore, in some embodiments, the post-development cure may be performed in the presence of oxygen. Oxygen may react in the blanket UV exposure to form ozone. Ozone may then react with any remaining alkyl groups to create volatile compounds that can be removed via a vacuum pump.

Post-development treatment of a PR has various advantages, including: reducing the PR thickness required for a subsequent pattern transfer etch, which may enable patterning directly on underlayers with lower etch selectivity, and hardening the footing of the resist feature, reducing variability in critical dimension loss during pattern transfer etch.

Process Flow

Figure 2:
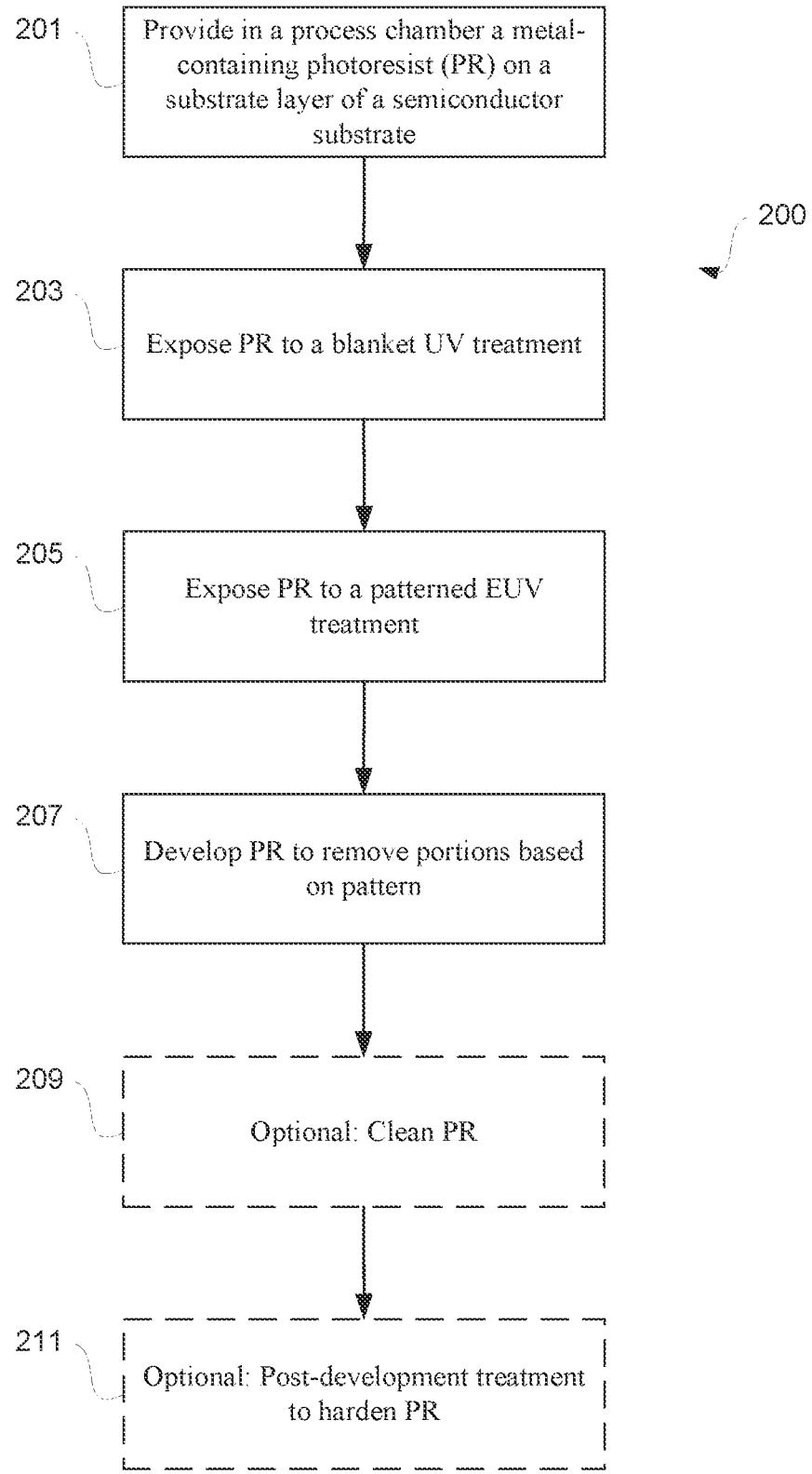
FIG. 2 presents a flow diagram of an operation for one example embodiment.

FIG. 2 depicts a process flow for a method of processing a semiconductor substrate. The method 200 involves, at 201, providing in a process chamber a metal-containing photoresist on a substrate layer of a semiconductor substrate. The substrate may be, for example, a partially fabricated semiconductor device film stack fabricated in any suitable way. At 203, the metal-containing photoresist is exposed to a blanket UV treatment to modify material properties of the metal-containing photoresist. In some embodiments, the material properties are modified such that etch selectivity in a subsequent post-exposure dry development process is increased. In some embodiments, the metal-containing photoresist is modified to increase cross-linking while still maintaining solubility. Furthermore, in some embodiments the metal-containing photoresist is modified to improve adhesion and reduce off-gassing. The treatment may involve an UV flood exposure with control of intensity and duration.

In operation 205, the PR is exposed to a patterned EUV lithography treatment to generate a pattern in the PR. In some embodiments, the dose of the EUV treatment is less than it would be without a PAC. Furthermore, while the discussion herein has discussed EUV lithography, the techniques disclosed herein may be used with higher wavelength lithography, such as 193 nm or 248 nm. After operation 205, the PR is developed in operation 207 to remove portions of the PR according to the lithographic pattern. The portions removed depend on whether the PR and development chemistry are for a negative-tone resist or a positive-tone resist. In some embodiments, development operation 207 is a dry process, while in other embodiments a wet process may be used.

Operation 209 is an optional process to clean the PR In some embodiments, there may be remaining scum after development, which may be removed by various processes. In other embodiments, the PR may have line edge roughness (LER) or line width roughness (LWR) resulting from the patterned EUV exposure, which may be reduced by a cleaning process during operation 209.

Operation 211 is another optional process to further cure the PR Similar to operation 203, the post-development PR is exposed to a blanket UV treatment. One difference between operations 203 and 211 is the degree of exposure: for a PAC, the blanket UV dose is not intended to induce a solubility switch in the PR. However, for operation 211, the blanket UV dose is intended to cure the PR by breaking any remaining Sn—C bonds and driving crosslinking to completion. Thus, the blanket UV dose may be much higher, e.g. 10×, 50×, or 100× higher than a PAC UV dose.

Process Parameters

In some embodiments, the wavelengths used for a blanket UV treatment are less than about 300 nm. In some embodiments, the blanket UV treatment uses an emitter with a peak wavelength of about 250 nm (e.g., 248 nm). In some embodiments, the emitter has a wavelength of about 190 nm (e.g., 193 nm). In some embodiments a broadband emitter is used, with a peak wavelength of e.g., less than about 300 nm, about 250 nm, or about 190 nm. In some embodiments, the energy dose for a PAC blanket UV treatment may be between about 1 and 100 mJ/cm$^2$ or between about 20 and 100 mJ/cm$^2$. For example, in some embodiments the energy dose for a PAC blanket UV treatment is between about 1-100, 2-80, or 3-60 mJ/cm$^2$ with a 248 nm emitter. In some embodiments the duration of a blanket UV treatment is between about 1 second and 300 seconds. In some embodiments, a plasma or electron beam exposure may be used instead of an optical treatment for either the PAC or post-development cure.

Figure 3:
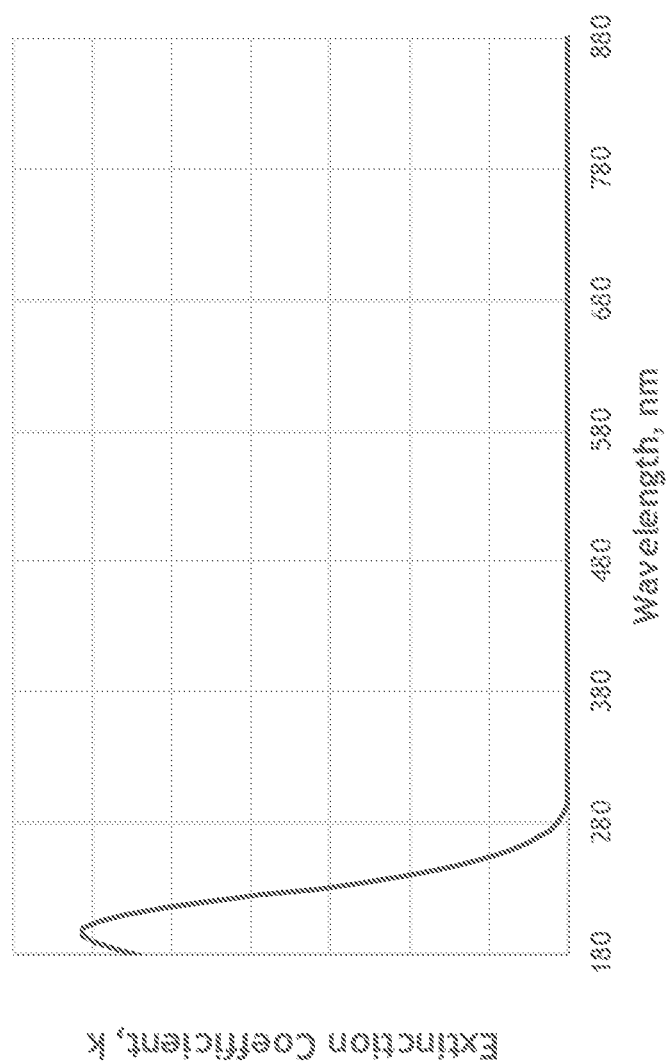
FIG. 3 presents an example absorption spectrum for a photoresist.

In some embodiments, the energy dose of a blanket UV treatment for a PR may generally decrease as the wavelength for the UV treatment decreases, as lower wavelength UV treatments may cause a greater effect on the PR for a similar dose. Generally, the effect of the UV treatment depends on the emission spectrum of the emitter and the absorption spectrum of the PR For example, where the PR has a higher absorption at a particular wavelength, e.g., about 190 nm, a lower blanket UV dose at that wavelength may be used than a wavelength where the PR has a lower absorption. FIG. 3 presents an example absorption spectrum for a PR that may be used with the present embodiments. As illustrated by the absorption spectrum of FIG. 3, lower wavelengths are more absorbed. Thus, less absorbed wavelengths may also be used for a UV blanket treatment, but the dose may be higher to achieve a similar effect as wavelengths that have a higher absorption. Furthermore, in some embodiments an underlying layer may affect the dose of the UV treatment.

In some embodiments, the patterned EUV lithography dose may be lower than otherwise used. In some embodiments, the energy dose for a patterned EUV exposure treatment may be between about 30 and 60 mJ/cm$^2$.

For a post-development cure, the dose may be at least about 10 mJ/cm$^2$ using a 193 nm emitter, and may be considerably higher at this or longer wavelengths. As noted above, a higher wavelength may use a higher dose, based on a lower absorption by the PR at higher wavelengths. In some embodiments, a plasma or electron beam exposure may be used instead of an optical treatment for either the PAC or post-development cure. In some embodiments, the post-development cure is performed in the presence of oxygen, e.g., at least 10 Torr partial pressure of oxygen, or between 10 Torr and atmospheric pressure oxygen.

Film Composition

A blanket UV treatment as described herein may be used with a variety of PR In some embodiments, the PR is an organic metal-oxide film that is dry deposited, such as a Tin-oxide film, as described elsewhere herein, and such as are described in U.S. Pat. App. No. 62/767,198, filed Nov. 14, 2018 and titled METHODS FOR MAKING HARD MASKS USEFUL IN NEXT-GENERATION LITHOGRAPHY, the disclosure of which at least relating to the composition, deposition, and patterning of directly photopatternable metal oxide films to form EUV resist masks is incorporated by reference herein. In other embodiments, the PR is a spin-on film or a CAR as described elsewhere herein. In some embodiments, the PR has a thickness of about 20 nm.

In some embodiments, the PR film has a sharp contrast curve. A sharp contrast curve may be defined by the majority of the solubility switch occurring within about a 2 mJ/cm$^2$ range of exposure. For example, an EUV PR film exposed to EUV without a blanket UV treatment may have a transition dose, or a dose to cause a solubility switch, of about 12 mJ/cm$^2$, where a majority of the solubility switch occurs within about 15-20% of the transition dose, or about 2 mJ/cm$^2$. Following a blanket UV treatment as described herein, the EUV dose to cause a transition may be lower, e.g., about 6 mJ/cm$^2$, where the solubility switch may still occur over about a 2 mJ/cm$^2$ range. A contrast curve may be measured by, for example, a thickness remaining after development as a function of EUV dose.

Example

Figure 4:
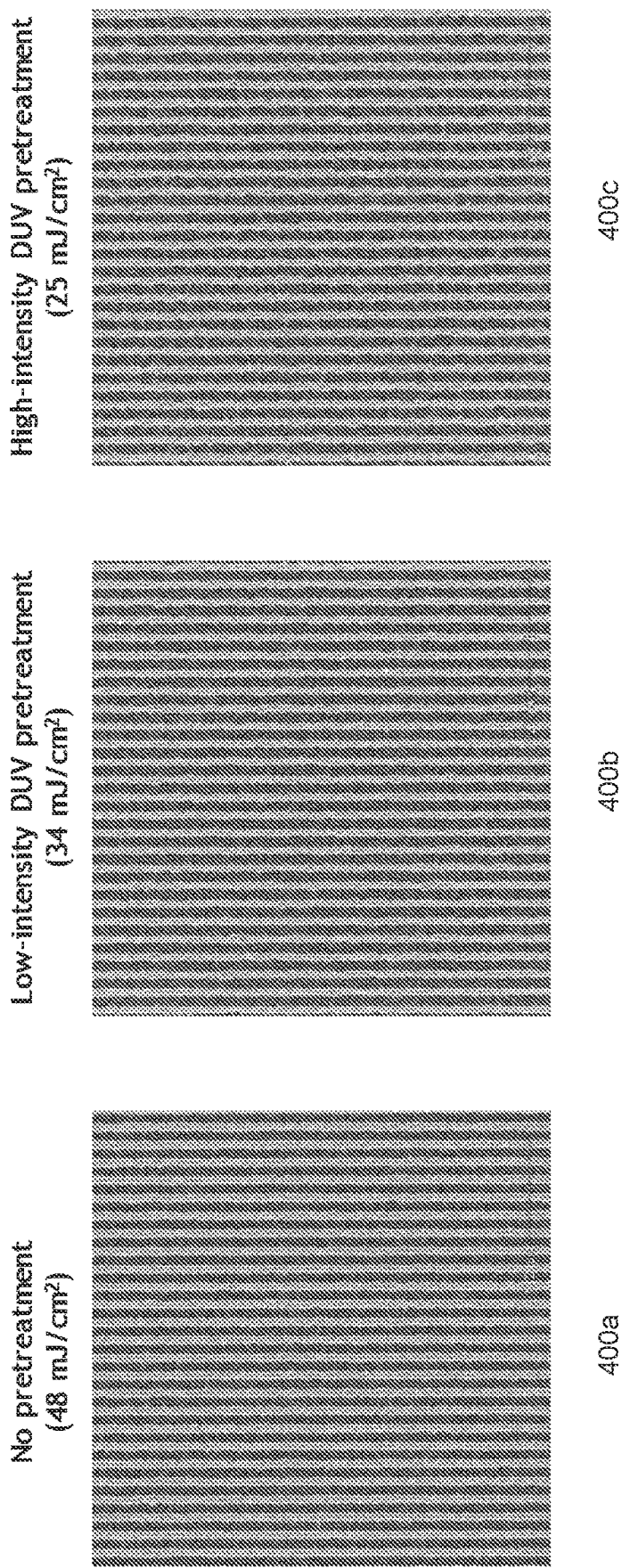
FIG. 4 presents examples of thin film lines produced using techniques discussed herein.

FIG. 4 provides examples of films 400a-c having various level of blanket UV treatment. Film 400a had no blanket UV treatment and was patterned with an EUV dose of 48 mJ/cm$^2$ to achieve the desired patterning. Film 400b had a low UV blanket treatment with an EUV dose of 34 mJ/cm$^2$. Film 400c had a high UV blanket treatment with an EUV dose of 25 mJ/cm$^2$. As noted above, a high EUV dose, such as the dose for film 400a, is typically used to cause a switch in solubility and define pattern lines in the PR, as illustrated in film 400a. However, using the techniques described herein, a blanket UV treatment may be used to reduce the required EUV dose to cause the solubility switch. As illustrated by films 400b and 400c, the use of a blanket UV treatment may permit a lower patterned EUV dose to cause a solubility switch. In films 400b and 400c, the blanket UV treatment pre-exposed the PR, reducing the EUV dose required to cause a shift in solubility without causing a significant shift in solubility for the unexposed areas. Thus, films 400b and 400c were patterned using a lower EUV dose than film 400a while still achieving similar line patterns. As a blanket UV treatment is less expensive than the patterned EUV dose, these techniques may reduce the time and cost to obtain a patterned film.

Apparatus

The present invention can be implemented in many different types of apparatus. Generally, the apparatus will include one or more chambers (sometimes referred to as process reactors) that house one or more wafers and are suitable for wafer processing. At least one chamber will include a UV source. A single chamber may be employed for all operations of the invention or separate chambers may be used. Each chamber may house one or more wafers for processing. The one or more chambers maintain the wafer in a defined position or positions (with or without motion within that position, e.g., rotation, vibration, or other agitation) during UV treatment operations. For certain operations in which the wafer is to be heated, the apparatus may include a heating plate.

In certain embodiments the cure process is performed using a multi-station cure chamber. As discussed above, in certain embodiments, the multiple operation cure processes of the invention rely on being able to independently modulate the UV intensity, wavelength, spectral distribution and substrate temperature of each step or operation. Additionally, certain inert or reactive gases may be injected during the cure process at the same or different flowrates at each step. Similarly, various effects of UV exposure (e.g. breaking metal-carbon bonds, generating ozone, process time, etc.) may be modulated by independently modulating UV intensity and substrate temperature. Detail process parameters of various examples are discussed below.

Multi-station cure chambers capable of modulating these effects by providing independent control of the substrate temperature and the UV intensity are described in above-referenced U.S. patent application Ser. No. 11/115,576 and in commonly assigned U.S. patent application Ser. No. 11/184,101, filed Jul. 18, 2005, titled "Cast Pedestal With Heating Element and Coaxial Heat Exchanger," which is hereby incorporated by reference in its entirety and for all purposes.

These chambers decouple substrate temperature and UV intensity by reducing the amount of IR radiation on the wafer and/or providing independent heat transfer mechanisms to and from the wafer. For example, the chambers may be equipped with cold mirrors or other reflectors to reduce the amount of IR radiation incident on the wafer. In addition, each pedestal or other substrate support may have an independent heat transfer mechanism to help maintain a substrate temperature regardless of the UV intensity. Thus, unlike conventional UV cure chambers where substrate temperature is coupled to UV intensity, the substrate temperature and UV intensity may be independently set for a wide range of temperatures and intensities.

Figure 5A:
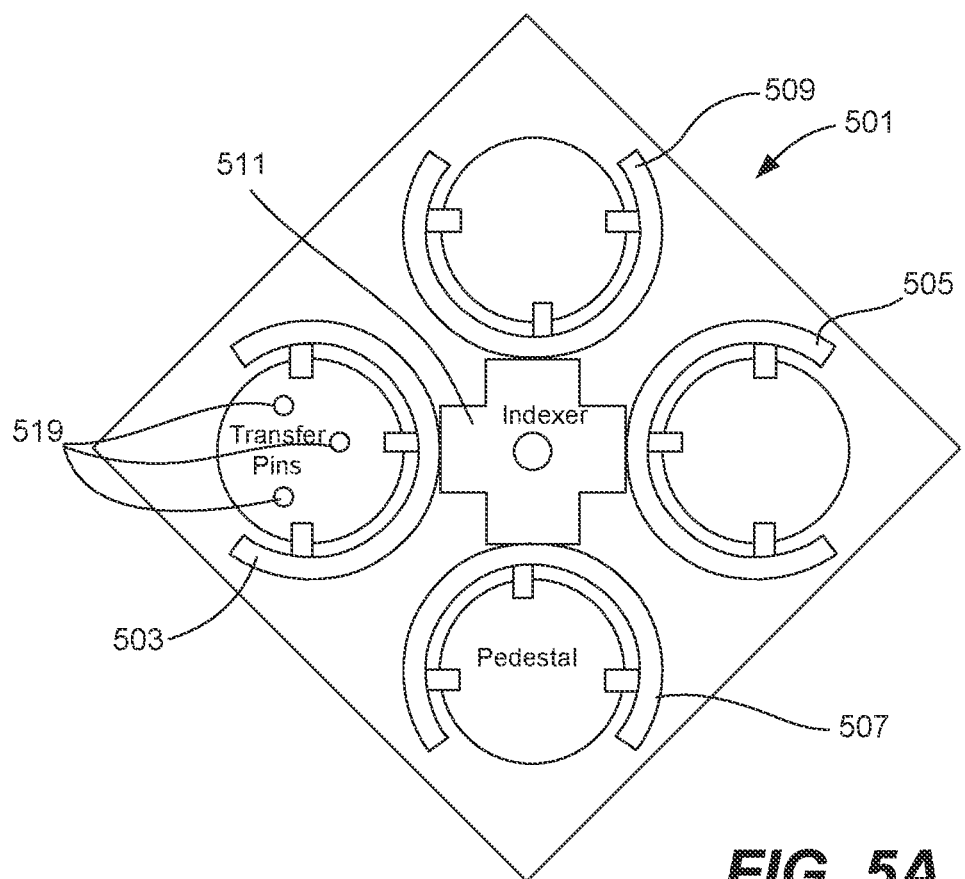
FIGS. 5A and 5B are schematic diagrams of examples of process chambers for performing methods in accordance with disclosed embodiments.
Figure 5B:
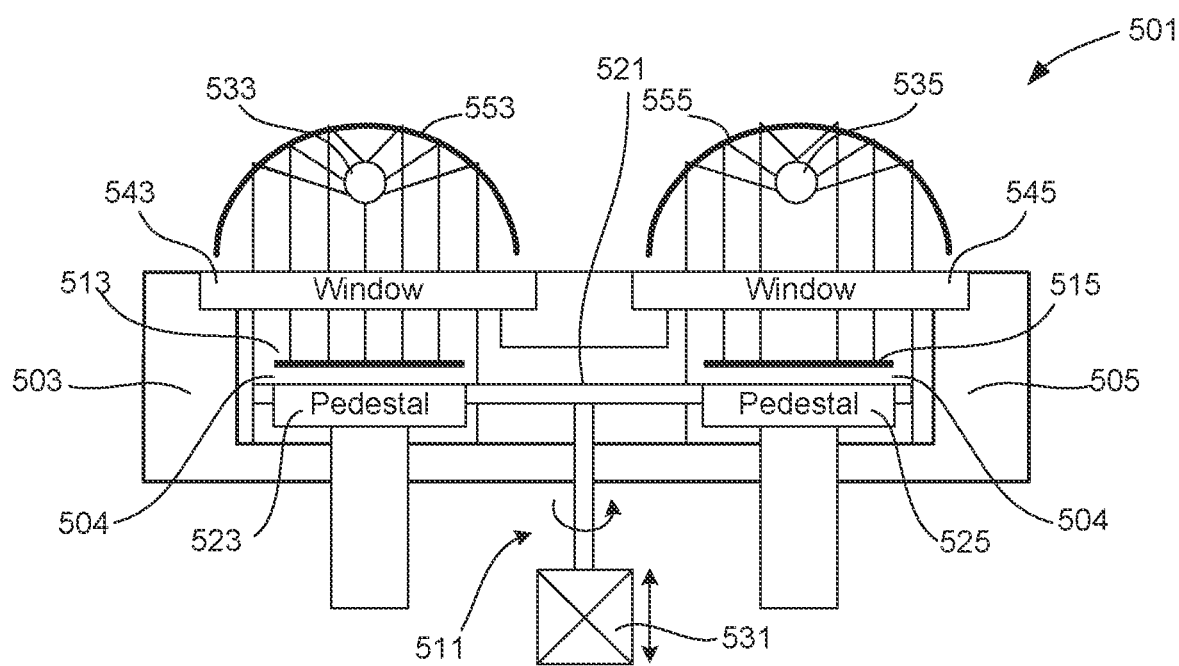

FIGS. 5A and 5B show one embodiment of an apparatus appropriate for use with certain embodiments of the invention that uses UV flood lamps. Chamber 501 includes multiple cure stations 503, 505, 507 and 509, each of which accommodates a wafer. Station 503 includes transfer pins 519. FIG. 5B is a side view of the chamber showing stations 503 and 505 and wafers 513 and 515 located above pedestals 523 and 525. There are gaps 504 between the wafers and the pedestals. The wafer may be supported above the pedestal by an attachment, such as a pin, or floated on gas. Parabolic or planar cold mirrors 553 and 555 are located above UV flood lamp sets 533 and 535. UV light from lamp sets 533 and 535 passes through windows 543 and 545. Wafers 503 and 505 are then exposed to the radiation. In alternative embodiments, the wafer may be supported by the pedestals 523 and 525. In such embodiments, the lamps may or may not be equipped with cold mirrors. By making full contact with the pedestal, the wafer temperature may be maintained by use of a conductive gas such as helium or a mixture of helium and argon at a sufficiently high pressure, typically between 50 and 760 Torr, but preferably between 100 and 600 Torr.

In operation, a wafer (or other substrate) enters the chamber at station 503. Pedestal temperature at station 503 may set to a first temperature, e.g. 220° C., with the UV lamps above station 503 set to a first intensity. In some cases, different stations irradiate the wafer at different wavelengths or wavelengths ranges. The example above uses a UV flood lamp, which generates radiation in a broad spectrum. Optical components may be used in the radiation source to modulate the part of the broad spectrum that reaches the wafer. For example, reflectors, filters, or combination of both reflectors and filters may be used to subtract a part of the spectrum from the radiation. One such filter is a bandpass filter.

Optical bandpass filters are designed to transmit a specific waveband. They are composed of many thin layers of dielectric materials, which have differing refractive indices to produce constructive and destructive interference in the transmitted light. In this way optical bandpass filters can be designed to transmit a specific waveband only. The range limitations are usually dependent upon the interference filters lens, and the composition of the thin-film filter material. Incident light is passed through two coated reflecting surfaces. The distance between the reflective coatings determines which wavelengths will destructively interfere and which wavelengths will be allowed to pass through the coated surfaces. In situations where the reflected beams are in phase, the light will pass through the two reflective surfaces. However, if the wavelengths are out of phase, destructive interference will block most of the reflections, allowing almost nothing to transmit through. In this way, interference filters are able to attenuate the intensity of transmitted light at wavelengths that are higher or lower than the desired range.

Another filter that can attenuate the wavelengths of the radiation reaching the wafer is the window 543, typically made of quartz. By changing the level of metal impurities and water content, the quartz window can be made to block radiations of undesired wavelengths. High-purity Silica Quartz with very little metal impurity is more transparent deeper into the ultraviolet. As an example, quartz with a thickness of 1cm will have a transmittance of about 50% at a wavelength of 170 nm, which drops to only a few percent at 160 nm. Increasing levels of impurities in the quartz cause transmission of UV at lower wavelengths to be reduced. Electrically fused quartz has a greater presence of metallic impurities, limiting its UV transmittance wavelength to around 200 nm. Synthetic silica, on the other hand, has much greater purity and will transfer down to 170 nm. For infrared radiation, the transmittance through quartz is determined by the water content. More water in the quartz means that infrared radiation is more likely absorbed. The water content in the quartz may be controlled through the manufacturing process. Thus, the spectrum of radiation transmission through the quartz window may be controlled to cutoff or reduce UV transmission at shorter wavelengths and/or to reduce infrared transmission at longer wavelengths.

Another type of filter is UV cut-off filters. These filters do not allow UV transmission below a set value, e.g. 280 nm. These filters work by absorbing wavelengths below the cut-off value. This may be helpful to optimize the desired cure effect.

Radiation wavelength can also be controlled by modifying the properties of the light generator. UV flood lamps can generate a broad spectrum of radiation, from UV to infrared, but other light generators may be used to emit a smaller spectrum or to increase the intensity of a narrower spectrum. Other light generators may be mercury-vapor lamps, doped mercury-vapor lamps, electrode lamps, excimer lamps, excimer lasers, pulsed Xenon lamps, doped Xenon lamps. Lasers such as excimer lasers can emit radiation of a single wavelength. When dopants are added to mercury-vapor and to Xenon lamps, radiation in a narrow wavelength band may be made more intense. Common dopants are iron, nickel, cobalt, tin, zinc, indium, gallium, thallium, antimony, bismuth, or combinations of these. For example, mercury vapor lamps doped with indium emits strongly in the visible spectrum and around 450 nm; iron, at 360 nm; and gallium, at 320 nm. Radiation wavelengths can also be controlled by changing the fill pressure of the lamps. For example, high-pressure mercury vapor lamps can be made to emit wavelengths of 250 to 440 nm, particularly 310 to 350 nm more intensely. Low-pressure mercury vapor lamps emit at shorter wavelengths.

In addition to changing light generator properties and the use of filters, reflectors that preferentially deliver one or more segments of the lamps spectral output may be used. A common reflector is a cold mirror that allows infrared radiation to pass but reflects other light. Other reflectors that preferentially reflect light of a spectral band may be used. Therefore a wafer may be exposed to radiation of different wavelengths at different stations. Of course, the radiation wavelengths may be the same in some stations.

In FIG. 5B, pedestals 523 and 525 are stationary. Indexer 511 lifts and moves each wafer from one pedestal to another between each exposure period. Indexer 511 is an indexer plate 521 attached to a motion mechanism 531 that has rotational and axial motion. Upward axial motion is imparted to indexer plate 521 to pick up wafers from each pedestal. The rotational motion serves to advance the wafers from one station to another. The motion mechanism then imparts downward axial motion to the plate to put the wafers down on the stations.

Pedestals 523 and 525 are electrically heated and maintained at a desired process temperature. Pedestals 523 and 525 may also be equipped with cooling lines, if needed. Each pedestal may have its own heating system. In an alternate embodiment, a large heater block may be used to support the wafers instead of individual pedestals. A thermally conductive gas, such as helium, is used to effect good thermal coupling between the pedestal and the wafer. In some embodiments, cast pedestals with coaxial heat exchangers may be used. These are described in above-referenced application Ser. No. 11/184,101.

FIGS. 5A and 5B show only an example of a suitable apparatus and other apparatuses designed for other methods involved in previous and/or subsequent processes may be used. For example, in another embodiment that uses flood lamps, the wafer support is a carousel. Unlike with the stationary pedestal wafer supports, the wafers do not move relative to the carousel. After a wafer is loaded onto the carousel, the carousel rotates, if necessary, to expose the wafer to light from a UV lamp set. The carousel is stationary during the exposure period. After the exposure period, the carousel rotates to advance each wafer for exposure to the next set of lamps. Heating and cooling elements may be embedded within the rotating carousel. Alternatively, the carousel may be in contact with a heater plate or hold the wafers so that they are suspended above a heater plate.

In certain embodiments, the substrates are exposed to UV radiation from focused, rather than, flood lamps. Unlike the flood lamp embodiments wherein the wafers are stationary during exposure (as in FIGS. 5A and 5B), there is relative movement between the wafers and the light sources during exposure to the focused lights as the wafers are scanned.

Other apparatuses designed for other methods involved in previous and/or subsequent processes may be used. For example, methods of the invention may be used with a standard PECVD chamber used to deposit the EUV PR layer if the chamber is equipped with a UV radiation source. Some supercritical fluid chamber systems may also be configured to include a UV radiation source. Many of these systems may also be used to perform blanket UV exposure procedures.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including UV exposure, the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method, comprising:
receiving in a process chamber a metal-containing photoresist on a substrate; and
treating the metal-containing photoresist by exposure to blanket UV to modify material properties of the metal-containing photoresist such that radiation sensitivity of the metal-containing photoresist is increased, wherein treating the metal-containing photoresist precedes exposing the metal-containing photoresist to EUV lithography.

2. The method of claim 1, wherein a wavelength of the blanket UV is DUV.

3. The method of claim 1, wherein a wavelength of the blanket UV is less than 300 nm.

4. The method of claim 3, wherein a wavelength of the blanket UV is about 248 nm.

5. The method of claim 3, wherein a wavelength of the blanket UV is about 193 nm.

6. The method of claim 1, wherein an intensity of the blanket UV is between 1 and 100 mJ/cm$^2$.

7. The method of claim 1, wherein treating the metal-containing photoresist increases the sensitivity of the metal-containing photoresist to EUV radiation.

8. The method of claim 1, wherein treating the metal-containing photoresist increases the adhesion of the metal-containing photoresist to the substrate.

9. The method of claim 1, wherein treating the metal-containing photoresist reduces off-gassing from the metal-containing photoresist.

10. The method of claim 1, wherein the solubility of the metal-containing photoresist changes abruptly within an EUV dose range of no more than about 2 mJ/cm$^2$.

11. The method of claim 1, wherein treating the metal-containing photoresist further comprises a thermal process with control of temperature, pressure, ambient gas chemistry, gas flow/ratio, and moisture.

12. The method of claim 1, further comprising:
exposing the metal-containing photoresist to patterned EUV light, and
developing the metal-containing photoresist to remove portions of the metal-containing photoresist.

13. The method of claim 12, wherein an intensity of the EUV light is between 20 and 100 mJ/cm$^2$.

14. The method of claim 12, wherein developing the metal-containing photoresist is a dry process.

15. The method of claim 12, wherein developing the metal-containing photoresist is a wet process.

16. The method of claim 12, wherein developing the metal-containing photoresist is a positive tone process.

17. The method of claim 12, wherein developing the metal-containing photoresist is a negative tone process.

18. The method of claim 12, further comprising, after developing the metal-containing photoresist, cleaning the metal-containing photoresist to remove scum.

19. The method of claim 12, further comprising, after developing the metal-containing photoresist, exposing the metal-containing photoresist to additional blanket UV to improve the etch selectivity of the metal-containing photoresist.

20. The method of claim 19, wherein exposing the metal-containing photoresist to additional blanket UV is performed in the presence of oxygen.

21. The method of claim 20, wherein the partial pressure of oxygen is at least 10 Torr.

22. An apparatus for depositing a thin film, the apparatus comprising:
a metal-containing photoresist deposition module comprising a process chamber for depositing a EUV-sensitive metal-containing film;
a controller including one or more memory devices and one or more processors, the one or more memory devices comprising computer-executable instructions for controlling the one or more processors to:
receive in the process chamber a metal-containing photoresist on a substrate; and
treat the metal-containing photoresist by exposure to blanket UV to modify material properties of the metal-containing photoresist such that radiation sensitivity of the metal-containing photoresist is increased, wherein the treating the metal-containing photoresist precedes exposing the metal-containing photoresist to EUV lithography.

23. The apparatus of claim 22, wherein the solubility of the metal-containing photoresist changes abruptly within an EUV dose range of no more than about 2 mJ/cm$^2$.

24. The apparatus of claim 22, further comprising:
exposing the metal-containing photoresist to patterned EUV light, and
developing the metal-containing photoresist to remove portions of the metal-containing photoresist.

25. The apparatus of claim 24, further comprising, after developing the metal-containing photoresist, exposing the metal-containing photoresist to additional blanket UV to improve the etch selectivity of the metal-containing photoresist.

* * * * *